(12) United States Patent
Sandhu et al.

(10) Patent No.: US 6,750,502 B1
(45) Date of Patent: Jun. 15, 2004

(54) TECHNIQUE TO QUENCH ELECTRICAL DEFECTS IN ALUMINUM OXIDE FILM

(75) Inventors: Sukesh Sandhu, Boise, ID (US); Kirk D. Prall, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/532,086

(22) Filed: Mar. 21, 2000

(51) Int. Cl.[7] ................... H01L 29/76; H01L 29/788
(52) U.S. Cl. ....................................... 257/315
(58) Field of Search ................. 257/314–324; 438/257–264

(56) References Cited

U.S. PATENT DOCUMENTS

| | | |
|---|---|---|
| 5,124,174 A | 6/1992 | Musket et al. |
| 5,348,894 A | 9/1994 | Gnade et al. |
| 5,471,364 A | 11/1995 | Summerfelt et al. |
| 5,674,788 A | 10/1997 | Wristers et al. |
| 5,888,870 A | 3/1999 | Gardner et al. |
| 5,923,056 A * | 7/1999 | Lee et al. ............... 257/410 |

FOREIGN PATENT DOCUMENTS

JP         404206777 A    *    7/1992

OTHER PUBLICATIONS

S. Wolf and R.N. Tauber, "Ion Implantation for VLSI," *Silicon Processing for the VLSI Era*, vol. 1—Process Technology, Chapter 9, pp. 280–327 (1986).

S. Wolf and R.N. Tauber, "Suprem III Models: Ion Implantation," *Silicon Processing for the VLSI Era*, vol. II, Chapter 9.2.2, pp. 658–661 (1986).

* cited by examiner

Primary Examiner—Cuong Nguyen
(74) Attorney, Agent, or Firm—Dickstein Shapiro Morin & Oshinsky LLP

(57) ABSTRACT

A novel technique to quench electrical defects in CVD $Al_2O_3$ layers is disclosed. A small amount of silicon dopant to the aluminum oxide film reduces the leakage current as well as the gap interface trap density at the dielectric/silicon interface. The implanted silicon gives a better interface and improves the leakage characteristics of the dielectric.

18 Claims, 7 Drawing Sheets

TECHNIQUE TO QUENCH ELECTRICAL DEFECTS IN ALUMINUM OXIDE FILM

FIELD OF THE INVENTION

The present invention relates generally to semiconductor circuits and, in particular, to a method for quenching defects in $Al_2O_3$ films.

BACKGROUND OF THE INVENTION

During the fabrication of metal-oxide-semiconductors (MOS), a silicon substrate is typically divided into a plurality of active and isolation regions through an isolation process. A thin gate oxide is subsequently grown on an upper surface of the substrate and over the active regions. A plurality of gates are then formed over the gate oxide layer, so that each gate bridges the substrate between doped source/drain regions. The source/drain regions are consequently implanted with an impurity concentration sufficient to render them conductive.

MOS technology is greatly employed in the fabrication of non-volatile memory cells. There are many types of non-volatile memory, and they are known in the art as either read-only memory (ROM) or programmable-read-only memory (PROM). One type of MOS PROM is the flash memory EPROM (Erasable Programmable ROM). Typically flash EPROMs are comprised as an array of paired transistors: a select or access transistor and a storage transistor. Many flash EPROMS combine these two transistors into one device—a split-gate transistor with two gates sharing a single device channel. The control gate (CG) serves the function of the select or access transistor, while the floating gate (FG) serves as a storage device.

Non-volatile MOS PROMs can be fabricated using well-known technologies such as floating gate tunnel oxide, textured polysilicon, or EPROM-tunnel oxide, among others. Program and erase of the corresponding EPROM cell differ depending upon the type of technology employed. For example, a floating gate tunnel oxide EPROM transistor is programmed (electrons are moved into the floating gate) by biasing the control gate, and erased (electrons are moved out of the floating gate) by biasing the drain.

An example of a conventional stacked-gate flash memory cell is illustrated in FIG. 1, where on a semiconductor substrate 10, source and drain regions 72 and 74, respectively, are displaced laterally between a pair of field oxide regions 14. Field oxide regions 14 are formed by isolation techniques such as STI or LOCOS processes, and they provide electrical and physical separation between neighboring active regions. A tunnel oxide 24, a floating gate 26, an inter poly dielectric 76, and a control gate 36 form gate structure 100 on the semiconductor substrate 10.

In recent flash memory technologies, short program/erase times and low operating voltages are the main obstacles to overcome in order to realize high speed and density, and low power operation. Thus, it has become increasingly necessary to increase the capacitive coupling between the floating gate and the control gate of the memory cell, while simultaneously inhibiting electrons from escaping from the floating gate to the control gate. The control gate-to-floating gate capacitance, which affects the coupling ratio, depends upon the thickness of the inter poly dielectric (IPD) 76 between the two gates and the relative permittivity or dielectric constant, K, of the inter-poly dielectric.

Attempts have been made at progressively reducing the thickness of IPD to increase the floating capacitance, but the results have been limited. A thinner gate dielectric provides greater drive current and therefore increased speed. In addition, a thinner gate dielectric has greater control over the channel charge, thus reducing short channel effects. Nevertheless, thinner gate dielectrics pose greater problems of reliability, quality and manufacturing. Decreasing the thickness of IPD to increase the floating gate capacitance may cause serious leakage problems, which are fatal in the retention time of flash cell memories.

To reduce leakage current, silicon nitride has been used as the inter poly dielectric. The silicon nitride is sandwiched between two thin layers of silicon dioxide, forming a multi layered ONO structure. The ONO structure, however, does not permit aggressive scaling required for high speed and long retention flash memories. In devices with a 0.2–0.3 $\mu$m gate length, such as 256 Mb flash memory, the ONO IPD should be around 12 nm. To realize such a thin film, strict control of each dielectric layer is required. ONO inter poly dielectric poses scaling limitations, and so, the high gate leakage current and pin-hole density may not permit the use of silicon dioxide for CMOS beyond 70 nm.

In an effort to increase the coupling ratio without increasing the cell area and without reducing the dielectric thickness, gate dielectrics with a K greater than that of silicon dioxide have been introduced. Paraelectric materials have dielectric constants that are usually at least two orders of magnitude above that of silicon dioxide, but several problems limit their use as gate dielectrics. One such problem is oxygen diffusion. During high temperature processes associated with semiconductor fabrication, oxygen diffuses from the inter poly dielectric to the interface between the inter poly and the two polygates which sandwich it, forming an undesirable oxide layer that decreases the overall capacitance of the dielectric system and counteracts, therefore, the effect of the high dielectric constant paraelectric material.

Metal oxides have been proposed also as high K materials for flash memory applications. Metal oxides, in particular aluminum oxide ($Al_2O_3$) for which K is higher than 8, have a low leakage current to guarantee ten years of retention time and have high temperature endurance for process integration. However, because the deposited high dielectric metal oxides have non-stoichiometric composition, they have large electrical defects or traps in the bulk of the dielectric and also at the dielectric/semiconductor interface. These defects or traps enhance conduction through the dielectric and reduce the breakdown strength of the dielectric. Further, even though the pure $Al_2O_3$ films have resistivity higher than silicon nitride, the density of the leakage current is not low enough for flash devices.

Accordingly, there is a need for an improved $Al_2O_3$ oxide film with low gate leakage and low interface state density at the dielectric/Si interface, which could be used for flash technology or memory cell capacitors, such as DRAM. There is also a need for an improved $Al_2O_3$ oxide film that is stable at temperatures higher than 800° C. and that confers, therefore, low leakage current.

SUMMARY OF THE INVENTION

The present invention provides a method for forming an improved $Al_2O_3$ oxide film, with low gate leakage and low interface state density, for use in flash technology or DRAM capacitors. The present method adds a small amount of silicon dopant to the aluminum oxide film to give a better interface and leakage characteristics. The $Al_2O_3$ oxide film is formed by chemical vapor deposition (CVD) that confers a better step coverage since it allows the control of the thickness of the oxide across the interface surface. The dielectric layer is subsequently subjected to silicon ion implantation and to a standard gas annealing process.

DETAILED DESCRIPTION OF THE PREFERRED EMBODIMENTS

In the following detailed description, reference is made to various specific embodiments in which the invention may be practiced. These embodiments are described with sufficient detail to enable those skilled in the art to practice the invention, and it is to be understood that other embodiments may be employed, and that structural, logical, and electrical changes may be made.

The terms "wafer" or "substrate" used in the following description may include any semiconductor-based structure that has an exposed silicon surface. Wafer and structure must be understood to include silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to a wafer or substrate in the following description, previous process steps may have been utilized to form regions or junctions in the base semiconductor or foundation.

The term "silicon dielectric" is used to indicate a silicon-based dielectric material such as silicon nitride or other silicon-based dielectrics with similar chemical characteristics, such as silicon oxide, silicon oxynitride, silicon oxime, and ONO (oxide-nitride-oxide) materials. The following detailed description is, therefore, not to be taken in a limiting sense, and the scope of the present invention is defined by the appended claims.

The present invention provides a method for forming an improved $Al_2O_3$ metal oxide film with low leakage for use in flash and other charge storage technologies. A small amount of silicon dopant is added to the $Al_2O_3$ film for a better interface and leakage characteristics. Chemical vapor deposition (CVD) is employed in this process because CVD is more conformal and allows a tighter control of the thickness of the dielectric than the control afforded by PVD.

Figure 1:
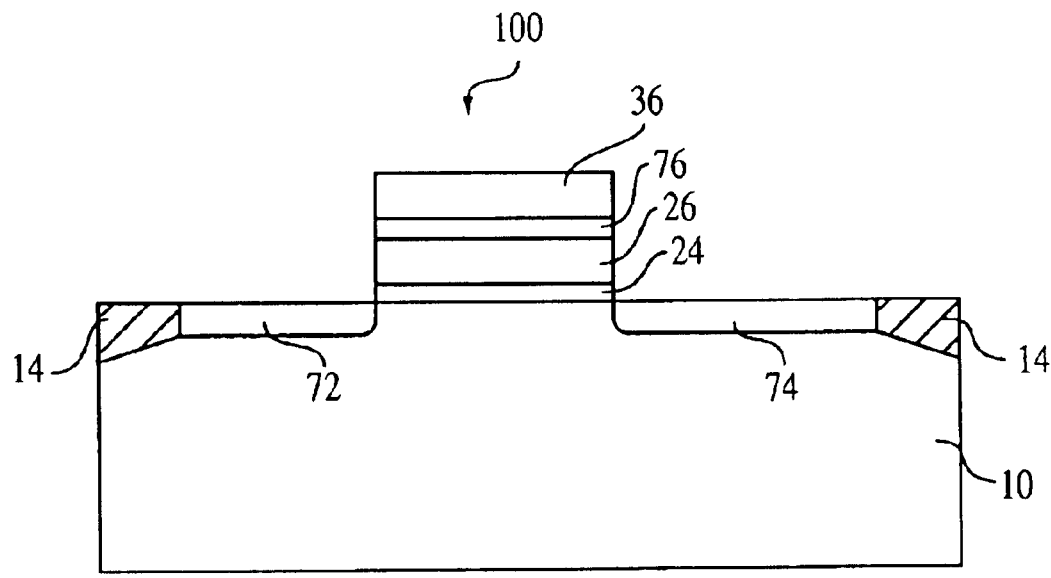
FIG. 1 illustrates a diagrammatic cross sectional view of a conventional flash memory cell.
Figure 2:
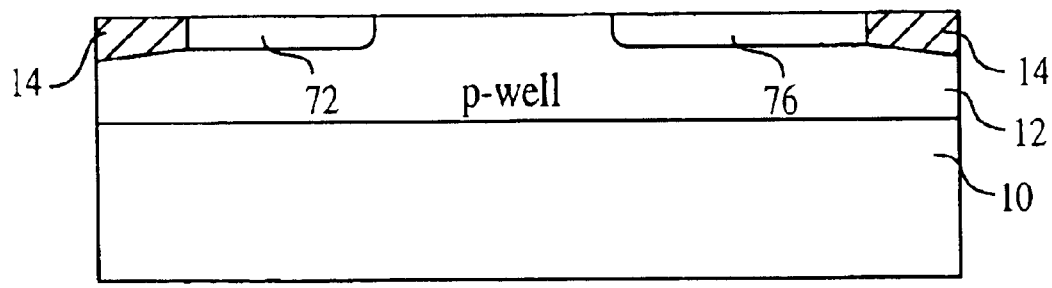
FIG. 2 illustrates a partial cross sectional view of a semiconductor topography, at an intermediate stage of processing, wherein a flash memory cell will be constructed in accordance with the present invention.

Referring now to the drawings, where like elements are designated by like reference numerals, FIG. 2 shows a partial cross sectional view of a conventional flash memory cell construction at an intermediate stage of the processing. A pair of memory cells having respective access transistors will be formed later within a semiconductor substrate 10. Substrate 10 of FIG. 2 includes a p-well 12, which is typically doped to a predetermined conductivity, e.g. p-type or n-type depending on whether NMOS or PMOS transistors will be formed therein. Source region 72 and drain region 74 are laterally displaced between a pair of isolation structures or field oxide regions 14. Field oxide regions 14 are formed by isolation techniques such as STI or LOCOS processes, and they provide electrical and physical separation, as well as isolation between neighboring active regions.

The source and drain region form an active region that represents the area of substrate 10 into which active devices such as transistors will be formed subsequently. N-type doped active regions are provided in the doped p-type well 12 of substrate 10 (for NMOS transistors).

Figure 3:
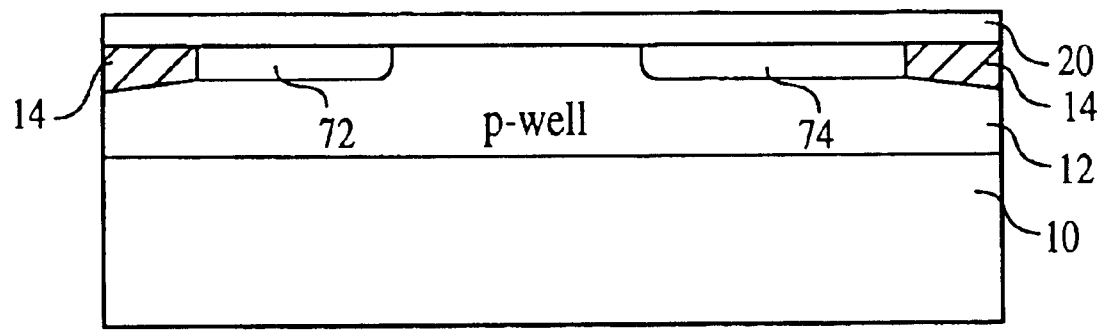
FIG. 3 illustrates a cross-sectional view of the representative flash memory cell according to the present invention at a stage of processing subsequent to that shown in FIG. 2.

Reference is now made to FIG. 3. A gate dielectric layer 20 is formed on the upper surface of substrate 10. The thickness of gate dielectric layer 20 is in the range of approximately 50 to 1,000 Å, preferably of about 100 Å, value that allows gate dielectric layer 20 to function as a tunnel oxide in the subsequent flash memory device. The value of the dielectric constant of the gate dielectric layer 20 is in the range of approximately 3.8 to 4.2.

In a preferred embodiment, the gate dielectric layer 20 may be formed by a thermal oxidation, in which the semiconductor substrate 10 is disposed in a furnace chamber maintained at a temperature at approximately 800 to 1000° C. under an oxygen ambient. A high K material, such as beryllium, magnesium, zirconium, calcium, tantalum or titanium, is also introduced. Alternatively, gate dielectric 20 may be formed by thermally growing oxynitride using a nitrogen and oxygen gas.

Figure 4:
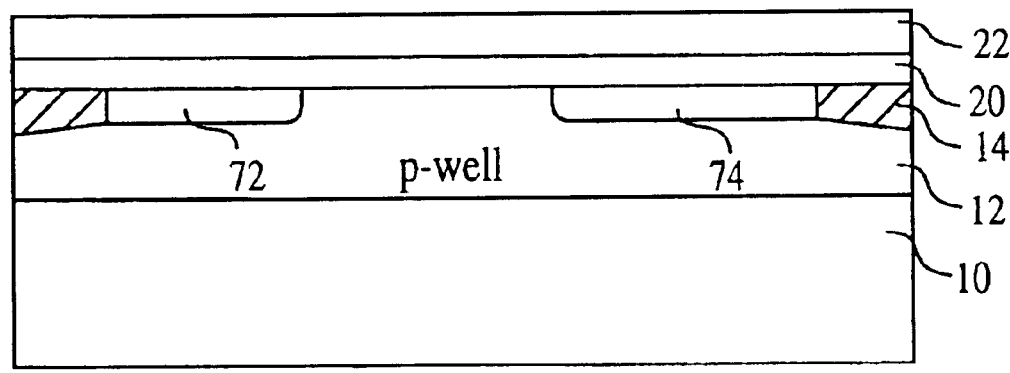
FIG. 4 illustrates a cross-sectional view of the representative flash memory cell according to the present invention at a stage of processing subsequent to that shown in FIG. 3.

Next, as shown in FIG. 4, a floating gate layer 22 formed of heavily doped polysilicon is deposited over gate dielectric layer 20. The preferred process for the formation of floating gate 22 includes the thermal decomposition of silane, in a CVD reactor chamber maintained at a temperature in the range of approximately 550 to 650° C. and at a pressure of less than approximately 2 Torrs. The thickness of the floating gate 22 is of approximately 200 to 2,000 Å. Subsequent to the polysilicon deposition, the polysilicon layer is typically implanted with phosphorous, boron, or arsenic to lower the resistivity of the conductive polysilicon gate layer 22. Nitrogen atoms may also be implanted into the floating gate 22. This way, nitrogen barrier atoms are incorporated within floating gate 22 and they fill up any vacancies and interstitial positions within the polysilicon, providing a barrier to any foreign atoms or molecules that could otherwise occupy the sites of those vacancies.

Figure 5:
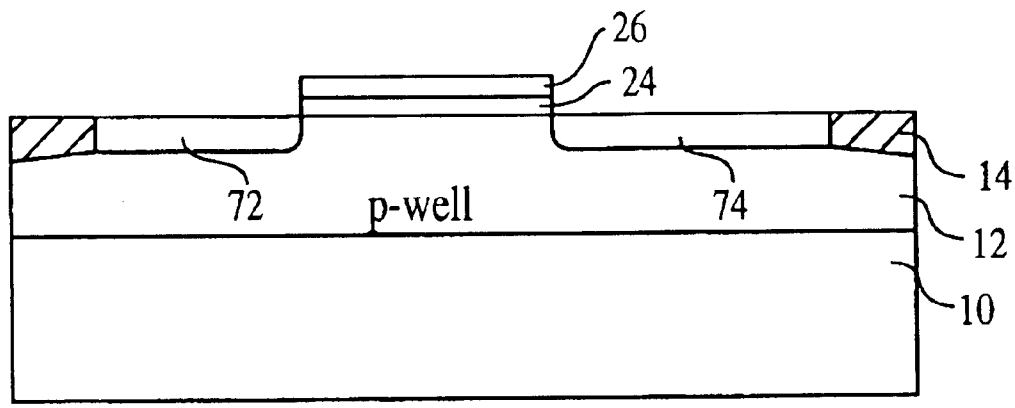
FIG. 5 illustrates a cross-sectional view of the representative flash memory cell according to the present invention at a stage of processing subsequent to that shown in FIG. 4.

Subsequent to the formation of floating gate layer 22 on dielectric layer 20, floating gate layer 22 and dielectric layer 20 are patterned by masking the gate structures with photoresist and etching exposed portions of floating gate layer 22 and dielectric layer 20 to obtain a gate dielectric 24 and a floating gate 26 as illustrated in FIG. 5.

Figure 6:
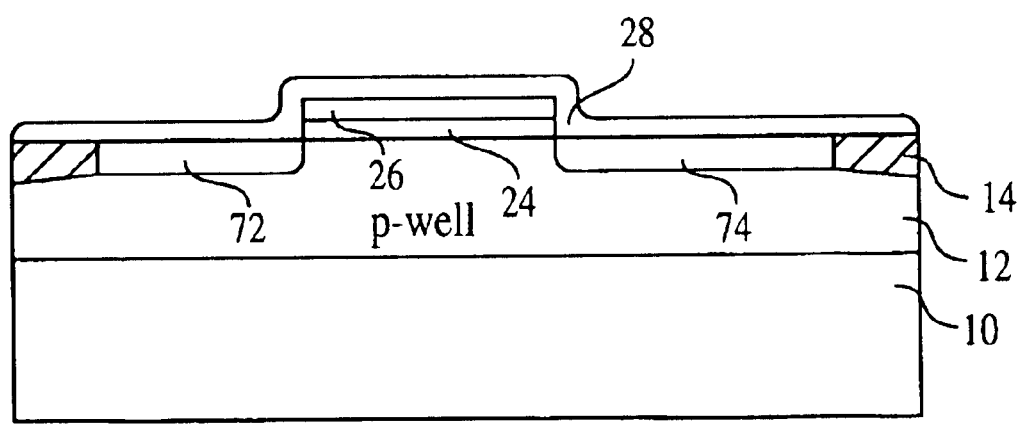
FIG. 6 illustrates a cross-sectional view of the representative flash memory cell according to the present invention at a stage of processing subsequent to that shown in FIG. 5.

At this point in the fabrication process, an insulating layer 28 formed of $Al_2O_3$ is deposited over the floating gate 26, as shown in FIG. 6. The deposition of layer 28 is achieved by chemical vapor deposition (CVD), that results in uniform coverage of approximately 0.2 to $1.0\mu$, preferably of approximately $0.5\mu$. To reduce the electrical defects or traps at the dielectric/silicon interface, that is the interface defined by the floating polysilicon gate 26 and the $Al_2O_3$ insulating layer 28 in FIG. 6, insulating layer 28 is electrically stabilized by adding dopants. By adding a small amount of silicon the high gate leakage current produced as a result of the large electrical defects in the bulk of the $Al_2O_3$ layer 28 and at the $Al_2O_3$/polysilicon interface is reduced.

Figure 7:
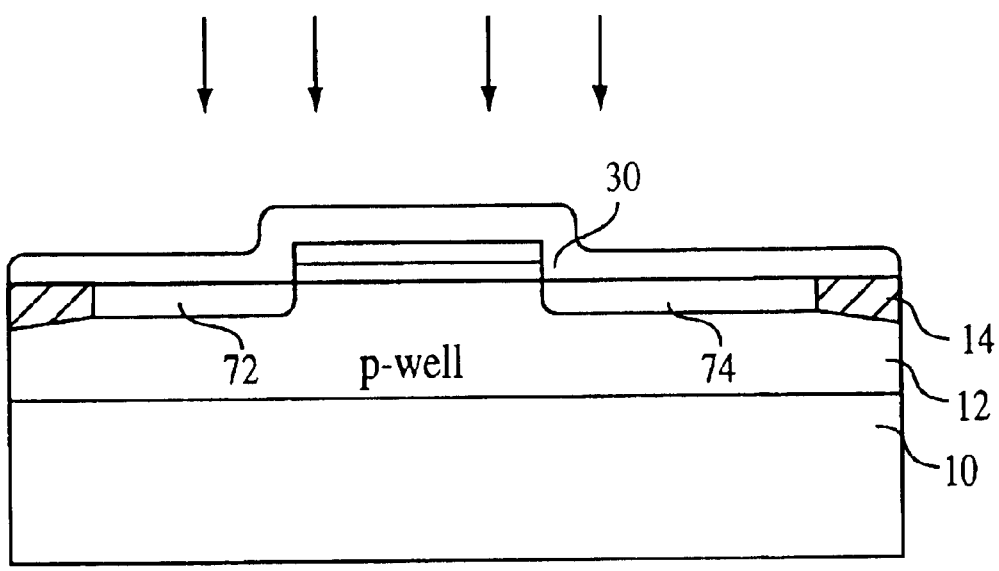
FIG. 7 illustrates a cross-sectional view of the representative flash memory cell according to the present invention at a stage of processing subsequent to that shown in FIG. 6.

Silicon ion implantation of the $Al_2O_3$ layer 28 may be achieved with an ion source. As it is known in the art, the amount of the implant, the concentration, and its distribution profile can be controlled by varying the beam current, voltage and exposure time. For example, silicon ions can be implanted into 0.2 to $1.0\mu$ areas, at an energy of approximately 10 keV and a dose of about $1\times10^{14}/cm^2$ to $1\times10^{15}/cm^2$, using a focussed ion beam implanter such as the one manufactured by Ion Beam Systems of Beverly, Mass., to form a silicon-doped $Al_2O_3$ insulating layer 30, as shown in FIG. 7.

Subsequent to the ion implantation step, the silicon-doped $Al_2O_3$ layer 30 may be annealed at a temperature of approximately 600 to 950° C.

Figure 8:
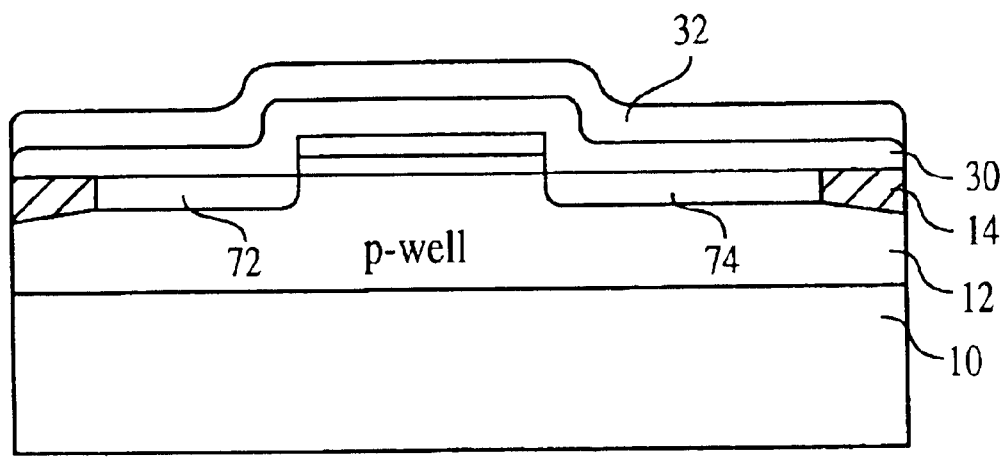
FIG. 8 illustrates a cross-sectional view of the representative flash memory cell according to the present invention at a stage of processing subsequent to that shown in FIG. 7.

Referring now to FIG. 8, a control gate layer 32 is formed over the silicon-doped $Al_2O_3$ insulating layer 30 using CVD of polysilicon. The control gate polysilicon layer 32 is preferably deposited in a CVD reactor chamber maintained at a temperature of approximately 550 to 650° C. and at a pressure of less than 2 Torrs. The thickness of the control gate layer 32 is of approximately 1,000 to 2,000 Å. Dopants such as phosphorous, boron, or nitrogen may be implanted subsequently into the control gate layer 32 to increase its conductivity. Subsequent to the formation of control gate layer 32, conventional photolithography steps are performed so that control gate layer 32 and doped $Al_2O_3$ interpoly oxide layer 30 are patterned by masking the gate structures with photoresist and etching exposed portions of control gate layer 32 and doped oxide layer 30 to obtain control gate 36 on top of patterned $Al_2O_3$ interpoly oxide layer 34, as illustrated in FIG. 9.

Figure 9:
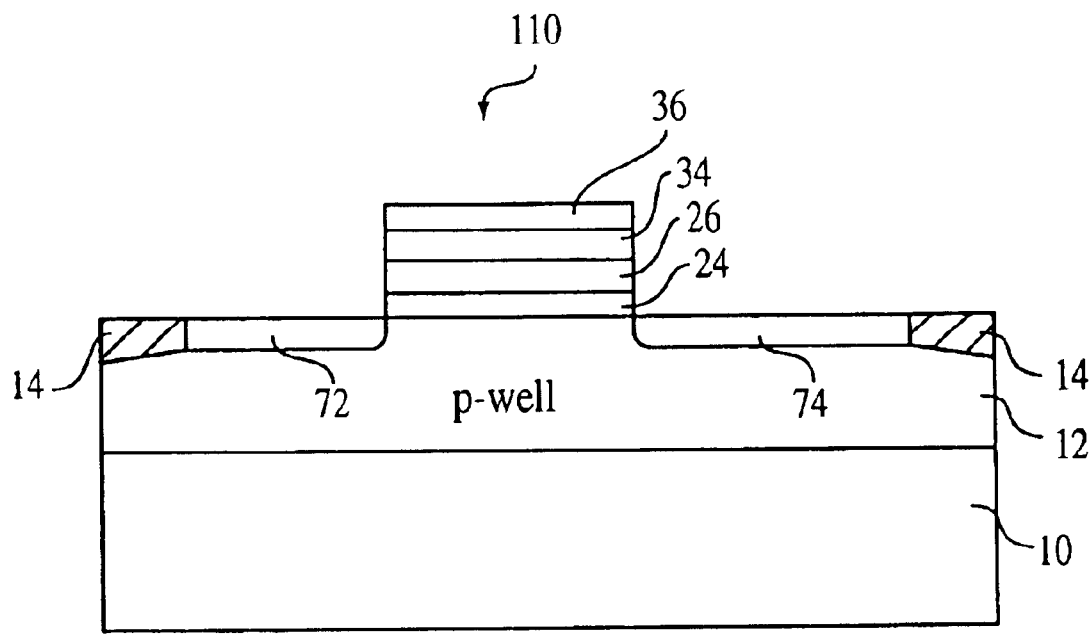
FIG. 9 illustrates a cross-sectional view of the representative flash memory cell according to the present invention at a stage of processing subsequent to that shown in FIG. 8.

Resulting non-volatile memory cell 110 of FIG. 9 includes gate dielectric 24, floating gate 26, silicon-doped $Al_2O_3$ insulating layer 34 and control gate 36. Bit line conductors may be subsequently coupled to the drain region 74 and the control gate 36 may be coupled to word lines of the integrated circuit. Supply voltage conductors may be subsequently coupled to source region 72. Charging of floating gate 26 to program the cell is achieved by grounding source and drain regions 72 and 74 and applying a relatively high voltage to control gate 36. In the programming state, electrons pass through gate dielectric 20 to floating gate 26 by a tunneling mechanisms known in the art as Fowler-Nordheim tunneling. As electrons accumulate in floating gate 26, the electric filed is reduced so that charge becomes stored in the floating gate 26. Discharge of the floating gate 26 to erase the flash memory cell is achieved by grounding control gate 36, floating gate 26, and source region 72 and applying a relatively high voltage to drain region 74.

Figure 10:
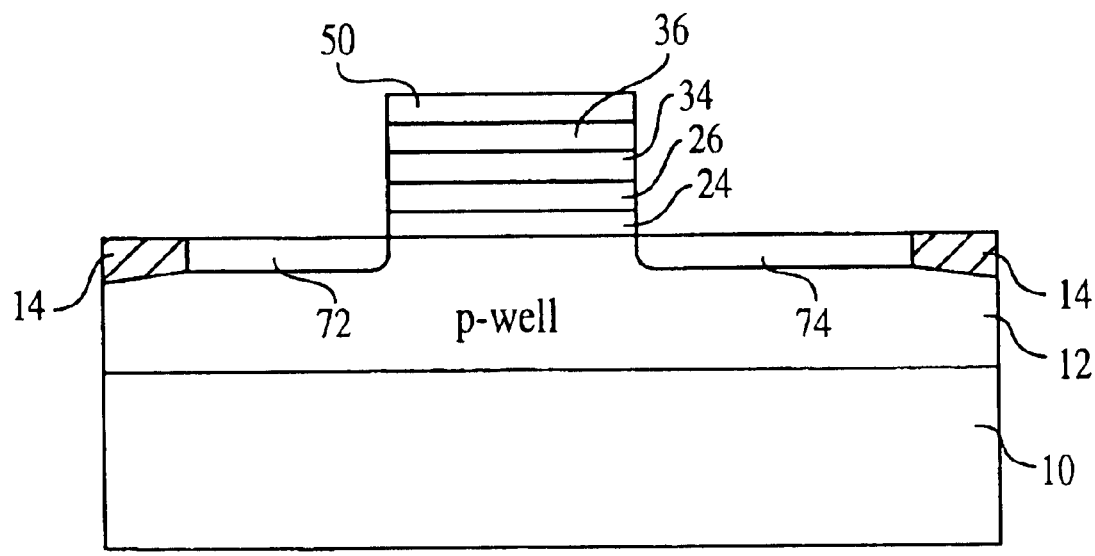
FIG. 10 illustrates a cross-sectional view of the representative flash memory cell according to the present invention at a stage of processing subsequent to that shown in FIG. 9.
Figure 11:
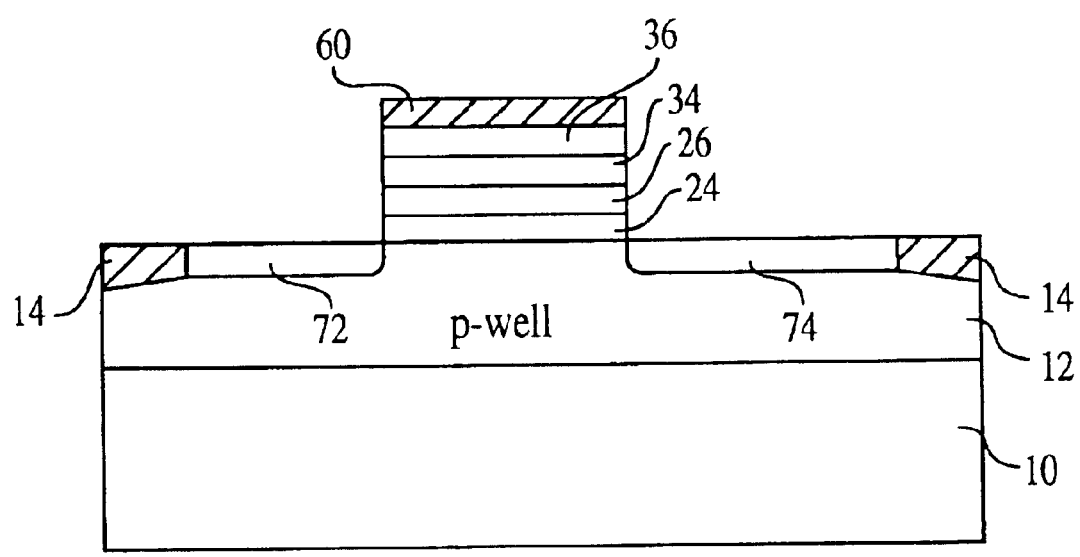
FIG. 11 illustrates a cross-sectional view of the representative flash memory cell according to the present invention at a stage of processing subsequent to that shown in FIG. 10.

Finally, as illustrated in FIG. 10, refractory metals such as titanium or cobalt may be formed across control gate 36, by sputter deposition or metal organic CVD from a source comprising a volatile metal organic compound, to form refractory metal layer 50. Next, refractory metal layer 50 may be heated to a temperature of approximately 700° C. by exposing it to a form of radiation, such as thermal radiation provided by a heated furnace, to initiate the reaction between metal atoms and silicon atoms from the polysilicon control gate 36 to form metal suicide layer 60 of FIG. 11.

Figure 12:
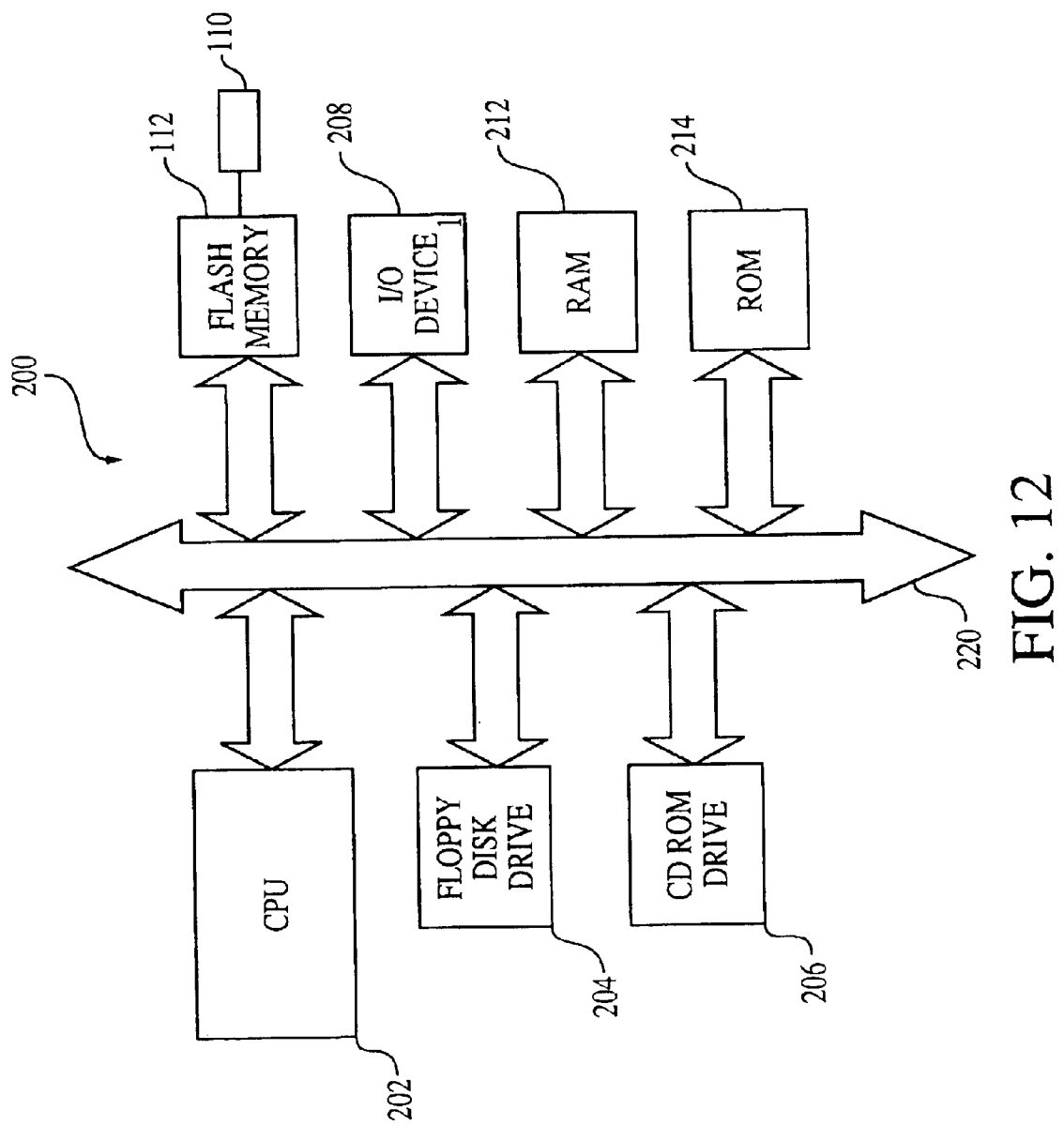
FIG. 12 is a schematic diagram of a processor system incorporating a memory cell of the present invention.

The resulting non-volatile memory cell 110 of the present invention may further be part of a processor-based system. FIG. 12 is a block diagram of a processor-based system 200 utilizing flash memory 112, which contains at least one integrated circuit having a non-volatile memory cell constructed in accordance with the present invention. That is, the flash memory 112 employs the memory cell 110 of the present invention. The processor-based system 200 may be a computer system, a process control system, or any other system employing a processor and associated memory.

The system 200 includes a central processing unit (CPU) 202, for example, a microprocessor, that communicates with the flash memory 112, an I/O device 208, and a RAM 212 memory over a bus 220. It must be noted that the bus 220 may be a series of buses and bridges commonly used in a processor-based system, but for convenience purposes only, the bus 220 has been illustrated as a single bus.

The processor-based system 200 also includes read-only memory (ROM) 214 and may include peripheral devices such as a floppy disk drive 204 and a compact disk (CD) ROM drive 206, which also communicate with the CPU 202 over the bus 220, as is well known in the art.

By employing CVD as the preferred method of forming all various layers of the memory cell, including the formation of implanted $Al_2O_3$ layer, the fabrication process is simplified and the fabrication time is reduced accordingly. The addition of small amounts of silicon ions into the $Al_2O_3$ layer quenches the electrical defects in the metal oxide film. Thus, the doping of the CVD $Al_2O_3$ layer significantly reduces the leakage current and the gap interface trap density at the $Al_2O_3$/silicon interface without inserting $SiO_2$ between silicon and $Al_2O_3$.

The above description illustrates preferred embodiments which achieve the features and advantages of the present invention. It is not intended that the present invention be limited to the illustrated embodiments. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A memory device comprising:
   a gate dielectric formed on a semiconductor substrate between source and drain regions;
   a floating gate over said gate dielectric;
   a silicon implanted $Al_2O_3$ layer over said floating gate, said silicon implanted $Al_2O_3$ layer having a silicon doping implant concentration of from approximately $1\times10^{14}/cm^2$ to approximately $1\times10^{15}/cm^2$, wherein said silicon implanted Al$_2$O$_3$ layer has a non-uniform dopant profile; and a control gate over said silicon implanted Al$_2$O$_3$ layer.

2. The memory device of claim 1 further comprising a silicide layer on top of said control gate.

3. The memory device of claim 1, wherein said gate dielectric is formed of a material selected from the group consisting of oxynitride and oxide.

4. The memory device of claim 1, wherein said memory device is a flash memory device.

5. A processor-based system, comprising:

a processor; and an integrated circuit coupled to said processor, said integrated circuit including a memory device, said memory device comprising:
  a gate dielectric formed over a semiconductor substrate on said integrated circuit between source and drain regions;
  a floating gate over said gate dielectric;
  a silicon implanted Al$_2$O$_3$ layer over said floating gate, said silicon implanted Al$_2$O$_3$ layer having a silicon doping implant concentration of from approximately 1×10$^{14}$/cm$^2$ to approximately 1×10$^{15}$/cm$^2$, wherein said silicon implanted Al$_2$O$_3$ layer is a non-uniform silicon implanted Al$_2$O$_3$ layer; and
  a control gate over said silicon implanted Al$_2$O$_3$ layer.

6. The processor-based system of claim 5 further comprising a silicide layer on top of said control gate.

7. The processor-based system of claim 5, wherein said gate dielectric is formed of a material selected from the group consisting of oxynitride and oxide.

8. The processor-based system of claim 5, wherein said memory device is a flash memory.

9. The processor-based system of claim 5, wherein said integrated circuit is part of a memory circuit.

10. A semiconductor device comprising:

a first conductive layer;

a second conductive layer; and a silicon implanted Al$_2$O$_3$ layer separating said first and second conductive layers, said silicon implanted Al$_2$O$_3$ layer having a silicon doping implant concentration of from approximately 1×10$^{14}$/cm$^2$ to approximately 1×10$^{15}$/cm$^2$, wherein said silicon implanted Al$_2$O$_3$ layer has a dopant gradient.

11. The semiconductor device of claim 10, wherein said device is a capacitor.

12. The semiconductor device of claim 10, wherein said device is part of a transistor gate stack which stores a charge.

13. The semiconductor device of claim 12, wherein said transistor gate stack is part of a flash memory cell.

14. The semiconductor device of claim 13 further comprising a silicide layer on top of said second conductive layer.

15. The semiconductor device of claim 10, wherein said second conductive layer is formed on a gate dielectric layer.

16. The semiconductor device of claim 15, wherein said gate dielectric layer is formed is formed of a material selected from the group consisting of oxynitride and oxide.

17. A memory device comprising:

a gate dielectric formed on a semiconductor substrate between source and drain regions;

a floating gate over said gate dielectric;

a silicon implanted Al$_2$O$_3$ layer over said floating gate, said silicon implanted Al$_2$O$_3$ layer having a silicon doping implant concentration of from approximately 1×10$^{14}$/cm$^2$ to approximately 1×10$^{15}$/cm$^2$, said silicon implanted Al$_2$O$_3$ layer being thermally stable at temperatures of from approximately 600° to approximately 950° C., wherein said silicon implanted Al$_2$O$_3$ layer has a dopant gradient; and a control gate over said silicon implanted Al$_2$O$_3$ layer.

18. A memory device comprising:

a gate dielectric formed on a semiconductor substrate between source and drain regions;

a floating gate over said gate dielectric;

a silicon implanted Al$_2$O$_3$ layer over said floating gate, said silicon implanted Al$_2$O$_3$ layer having a silicon doping implant concentration of from approximately 1×10$^{14}$/cm$^2$ to approximately 1×10$^{15}$/cm$^2$, said silicon implanted Al$_2$O$_3$ layer being thermally stable at temperatures greater than 800° C.; and, a control gate over said silicon implanted Al$_2$O$_3$ layer.

* * * * *

UNITED STATES PATENT AND TRADEMARK OFFICE
CERTIFICATE OF CORRECTION

PATENT NO. : 6,750,502 B1
DATED : June 15, 2004
INVENTOR(S) : Sukesh Sandhu et al.

It is certified that error appears in the above-identified patent and that said Letters Patent is hereby corrected as shown below:

Column 5,
Line 67, replace "filed" with -- field. --

Signed and Sealed this

Twenty-first Day of September, 2004

JON W. DUDAS
*Director of the United States Patent and Trademark Office*